United States Patent [19]
Gernon et al.

[11] Patent Number: 5,282,953
[45] Date of Patent: Feb. 1, 1994

[54] POLYOXYALKLENE COMPOUNDS TERMINATED WITH KETONE GROUPS FOR USE AS SURFACTANTS IN ALKANESULFONIC ACID BASED SOLDER PLATING BATHS

[75] Inventors: Michael D. Gernon, King of Prussia, Pa.; Harry H. Kroll, E. Greenwich; Hanoch S. Elroi, Wakefield, both of R.I.

[73] Assignee: Technic Incorporated, Cranston, R.I.

[21] Appl. No.: 83,660

[22] Filed: Jun. 28, 1993

[51] Int. Cl.$^5$ ............................ C25D 3/32; C25D 3/56
[52] U.S. Cl. .................................. 205/253; 205/254; 205/302; 205/303; 106/1.05
[58] Field of Search ............... 205/253, 254, 302, 303; 106/1.05

[56] References Cited

U.S. PATENT DOCUMENTS

| | | | |
|---|---|---|---|
| 4,459,185 | 7/1984 | Obata et al. | 204/43 |
| 4,582,576 | 4/1986 | Opaskar et al. | 204/44.4 |
| 4,662,999 | 5/1987 | Opaskar et al. | 204/44.4 |
| 4,673,470 | 6/1987 | Obata et al. | 204/44.4 |
| 4,844,780 | 7/1989 | Lee | 204/44.4 |
| 4,923,576 | 5/1990 | Kroll et al. | 204/44.4 |
| 4,981,564 | 1/1991 | Kroll et al. | 204/44.4 |
| 4,994,155 | 2/1991 | Toben et al. | 204/28 |
| 5,072,050 | 12/1991 | Sanderson et al. | 568/314 |
| 5,110,423 | 5/1992 | Little et al. | 205/254 |

OTHER PUBLICATIONS

Stevens et al., J. Org. Chem., 45, 2030-2032 (1980).

*Primary Examiner*—John Niebling
*Assistant Examiner*—Kishor Mayekar
*Attorney, Agent, or Firm*—Ernest V. Linek

[57] ABSTRACT

Baths and methods for the electroplating of tin, tin-lead, tin-antimony, and/or tin-bismuth are described. Specifically, electrodeposition solutions, based on alkanesulfonic acids, soluble metal salts, other additives, and at least one nonionic surfactant terminated with a ketone group, have been developed. The use of ketone (e.g., $-OCH_2COCH_3$) terminated polyoxyalkylene surfactants results in electrodeposition solutions with reduced foam, and the tin and tin alloy electrodeposits from such plating baths are of superior quality.

25 Claims, No Drawings

POLYOXYALKLENE COMPOUNDS TERMINATED WITH KETONE GROUPS FOR USE AS SURFACTANTS IN ALKANESULFONIC ACID BASED SOLDER PLATING BATHS

TECHNICAL FIELD

This invention relates to alkanesulfonic acid based electroplating formulations. Specifically, the invention involves the use of polyoxyalkylene compounds terminated with ketone groups as low foam surfactant additives to alkanesulfonic acid based tin, tin/lead, tin/antimony, or tin/bismuth electroplating formulations.

BACKGROUND OF THE INVENTION

Tin, tin/lead, tin/antimony, and tin/bismuth electrodeposits, known collectively as solder deposits, are utilized in the finishing of electronic components. Plating formulations for the electrodeposition of these solder alloys often employ surfactants as grain refining additives. The choice of the surfactants to be included in a solder plating bath is guided by the need to produce an electrodeposit with favorable surface and mechanical properties. Further restraints on the selection of surfactants are introduced by the need for formulations which can function effectively in "high speed" plating equipment. High speed solder plating can be defined as electroplating where the pace of work requires a current density greater than 120 ASF (amps per square foot) and vigorous solution agitation. The operation of high speed plating baths requires that a minimal foam level be maintained in the operating plating solution.

Low foam surfactants have been commercially available for many years, but not all low foam surfactants are suitable for electroplating applications. The discovery of novel low foam surfactants having a useful function in solder alloy electrodeposition formulations is considered to be an advancement in the field of plating science.

U.S. Pat. No. 5,072,050 (Sanderson et al.) discloses methods for the oxidation of the secondary hydroxy group in 2-hydroxypropyl ($-OCH_2CHOHCH_3$, oxypropylene capped) terminated nonionic surfactants. The oxidation of 2-hydroxypropyl ($-OCH_2CHOHCH_3$) terminated polyoxyalkylene compounds yields the corresponding methyl ketone terminated materials ($-OCH_2COCH_3$). The advantageous properties of plating formulations containing polyoxyalkylene compounds terminated with ketone (e.g., $-OCH_2COCH_3$) have not previously been disclosed. Propoxy terminated nonionic surfactants exhibit reduced foaming after complete or partial conversion to ketone termination. Generally, a conversion (hydroxyl to ketone termination) of at least 5% has an effect in reducing foam, and significant reduction occurs in the 20% to 100% conversion range. Plating formulations containing ketone terminated polyoxyalkylene surfactants produce improved deposits when compared to compositions containing the corresponding hydroxyl terminated materials.

INFORMATION DISCLOSURE STATEMENT

Other art of interest in this application includes the following:

| U.S. PATENT DOCUMENTS | | |
|---|---|---|
| 4,459,185 | 7/1984 | Obata et al. |
| 4,582,576 | 4/1986 | Opasker et al. |
| 4,662,999 | 5/1987 | Opasker et al. |
| 4,673,470 | 6/1987 | Obata et al. |
| 4,844,780 | 7/1989 | Lee |
| 4,923,576 | 5/1990 | Kroll et al. |
| 4,981,564 | 1/1991 | Kroll et al. |
| 4,994,155 | 2/1991 | Toben et al. |
| 5,072,050 | 12/1991 | Sanderson et al. |
| 5,110,423 | 5/1992 | Little et al. |

OTHER PUBLICATIONS

Stevens, R. V.; Chapman, K. T.; Wellor, H. N. J. Org. Chem. 1980, 45, 2030–2032.

Siggia, S.; Hanna, J. G. Quantitative Organic Analysis Via Functional Groups, 4th Ed. 1979, ISBN 0-471-03273-5, J. Wiley and Sons, N.Y., 95-161.

SUMMARY OF THE INVENTION

The present invention relates to the use of low foaming alkyl ketone terminated polyoxyalkylene surfactants in tin and tin alloy plating formulations. The alkyl ketone terminated polyoxyalkylene compounds are prepared by the selective oxidation of the terminal secondary hydroxyl group in terminal propoxylated surfactants.

In the present invention, one or more ketone terminated polyoxyalkylene surfactants were combined in aqueous solution with methanesulfonic acid, stannous methanesulfonate, plumbous methanesulfonate, other nonionic surfactants, and organic additives to produce novel solder plating formulations. In particular, the foam generation and the foam stability of such novel plating formulations is less than that obtained when the corresponding hydroxyl terminated materials are used. Other superior alkanesulfonic acid based solder (pure Sn, Sn/Sb, and Sn/Bi) plating formulations based on ketone terminated polyoxyalkylene surfactants were also developed.

DETAILED DESCRIPTION OF THE PREFERRED EMBODIMENTS

One object of this invention is the preparation of improved low foam surfactants for use in high speed automated plating equipment. In addition to being low foaming, the formulations disclosed herein produce deposits with improved mechanical and surface properties. The novelty introduced into these prior art plating formulations comes from the incorporation of ketone terminated polyoxyalkylene type nonionic surfactants. Such modified polyoxyalkylene compounds can be represented by the structure:

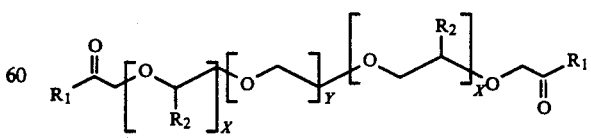

wherein;

X can vary between 0 and 80 preferably between 9 and 50, and Y can vary between 0 and 200 preferably between 6 and 150. $R_1$ can be a $C_1$ to $C_6$ straight chain alkyl group, preferably a methyl group. $R_2$ can be a $C_1$ to $C_6$ straight chain alkyl group, preferably a methyl group.

Such ketone terminated polyoxyalkylene compounds are obtained via oxidation of the corresponding hydroxyl terminated materials;

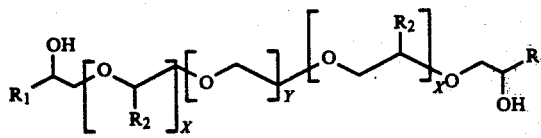

wherein;

X, Y, $R_1$ and $R_2$ are defined as above. Such hydroxyl terminated nonionic surfactants are commercially available as Pluronic R polyglycols (BASF Corp., Parsippany, N.J.). The block copolymers are made by sequential addition of ethylene oxide to ethylene glycol and then propylene oxide to the poly(ethyleneglycol). Pluronic R polyglycols are obtained as a distribution of oligomers. Typical dispersivities of the Pluronic R surfactants are between 1.08 and 2.20, derived from $M_n/M_w$ where $M_n$ is the number average molecular weight and $M_w$ is the weight average molecular weight. If all of the molecules have the same molecular weight $M_n=M_w$ and $M_n/M_w=1$. The ketone terminated compounds derived from hydroxyl terminated surfactants will also be distributions of oligomers, and the dispersivity of the ketone terminated materials will usually be higher than the dispersivity of the hydroxyl terminated precursor.

Another type of useful modified polyoxyalkylene compound can be represented by the general formula;

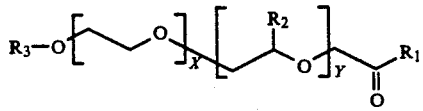

wherein;

X can vary between 0 and 200 preferably between 6 and 150, and Y can vary between 0 and 120 preferably between 9 and 100. $R_1$ is a $C_1$ to $C_6$ straight chain alkyl group preferably a methyl group. $R_2$ can be a $C_1$ to $C_6$ straight chain alkyl group preferably a methyl group. $R_3$ is a hydrophobic residue which can be a $C_1$ to $C_{20}$ straight or branched chain alkyl group, a substituted phenyl group where the substitution is a $C_1$ to $C_{20}$ straight or branched chain alkyl group, a monostyrenated phenyl group, a distyrenated phenyl group, a tristyrenated phenyl group, or any other typical hydrophobic residue used in the preparation of nonionic surfactants.

Such ketone terminated polyoxyalkylene compounds are obtained via oxidation of the corresponding hydroxyl terminated materials;

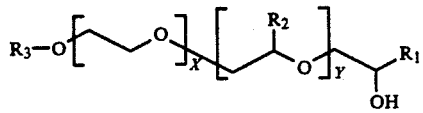

X, Y, $R_1$, $R_2$ and $R_3$ are defined as above. Such materials are normally obtained as a mixture of oligomers with typical dispersivities of 1.08 to 2.2 ($M_n/M_w$).

The dispersivity of the ketone terminated material will be usually greater than the dispersivity of the hydroxyl terminated material from which it was derived.

Previous workers have succeeded in producing bright tin and tin alloy deposits by incorporating various low molecular weight aldehydes and ketones into the plating formulations (see, e.g., the patents to Little, Lee and Opasker cited supra). In the present invention, matte solder deposits are obtained. Bright deposits may be obtained from formulations containing ketone terminated polyoxyalkylene compounds if known brightening agents, such as glutaraldehyde, acetaldehyde, 2-chlorobenzaldehyde, 2-naphthaldehyde, and similar aliphatic and aromatic aldehydes, are included in the formulation. The primary benefit derived by incorporation of ketone terminated polyoxyalkylene nonionic surfactants in tin and tin alloy systems is a reduction of foam in the plating process. A secondary benefit of the use of ketone terminated nonionic surfactants is an improvement in the efficiency of the process and electrodeposits with improved mechanical and surface qualities. The present invention is centered on the use of these novel modified polyoxyalkylene surfactants in alkanesulfonic acid based tin and tin alloy plating systems.

In the preferred embodiment of the present invention, one or more ketone terminated polyoxyalkylene type surfactants are combined with hydroxyl terminated polyoxyalkylene surfactants and selected organic compounds to produce an additive formulation for use in tin or tin alloy plating baths. The organic compounds are antioxidants and grain refiners. The other surfactants used in these formulations can be selected from the hydroxyl-terminated structures represented above or from the general surfactant structures mentioned in U.S. Pat. Nos. 4,923,576 and 4,981,564 (Kroll et al.) If desired, other surfactants, e.g., anionic and/or cationic surfactants, known in this art may also be employed.

In the present invention, a system containing one or more ketone terminated polyoxyalkylene surfactants or a mixture of a hydroxyl terminated polyoxyalkylene surfactant and a ketone terminated polyoxyalkylene surfactant was required for optimal performance.

Formulated plating additives were mixed with an aqueous solution of methanesulfonic acid, stannous methane sulfonate, and lead methanesulfonate to produce a plating solution. Such a plating solution can be used in high speed plating equipment for the electrodeposition of high quality tin or tin alloy coatings.

Methanesulfonic acid (MSA) concentration in such plating solutions will normally be between 4% and 30% v/v based on the commercially available 70% MSA. Stannous methanesulfonate concentration will normally be between 20 g/l and 200 g/l based on the metal. Plumbous methanesulfonate concentration will normally be between 1 g/l and 80 g/l based on the metal. The ratio of stannous to plumbous methanesulfonate concentrations will be adjusted to produce a solder with between 50% and 100% tin. Other soluble salts of tin and lead may be used in place of the methanesulfonates.

Lead may be replaced in the solder alloy by either antimony or bismuth. For Sn/Sb solders, soluble salts of antimony are combined with stannous methanesulfonate. Particularly useful is potassium antimony (III)tartrate (tartar emetic) at concentrations of 0.01 g/l to 5 g/l based on the metal. The composition of Sn/Sb solders will normally be between 95% and 100% tin. For Sn/Bi solders, soluble salts of bismuth are combined with stannous methanesulfonate. Particularly useful is bismuth (III) methanesulfonate at concentrations between 1 g/l and 80 g/l based on the metal. The composition of Sn/Bi solders will normally be between 50% and 100% tin.

The present invention is illustrated by the examples below. In all cases, systems containing ketone terminated polyoxyalkylene compounds are shown to be an improvement over the identical systems in which only the corresponding hydroxyl terminated polyoxyalkylene compounds are used.

EXAMPLE 1

Some typical methods for the preparation of ketone-terminated polyoxypropylene capped polyoxyalkylene compounds can be found in the Sanderson patent. Several methods were used for the synthesis of the ketone terminated polyoxyalkylene compounds. The following two procedures are exemplary.

Procedure (Sanderson method)

A solution of 55.0 grams of polypropylene glycol (PPG, average molecular weight=425, 130 mmol) dissolved in 150 grams of glacial acetic acid was cooled in an ice bath to 15° C. The cooled solution was treated dropwise with 75.0 grams of 13% NaOCl (aq, standardized by thiosulfate titration) at such a rate that the temperature was maintained between 15° to 20° C. After hypochlorite addition was complete, the slightly yellowish solution was stirred at room temperature for 1 hour during which time the color disappeared. An aqueous solution of sodium sulfite (100 g/l, app. 5 ml) was added slowly until a check for excess hypochlorite by iodiode color test was negative. The whole solution was diluted to 750 ml with DI water and extracted with $CHCl_3$ (2×300 ml). The combined organic phase was washed with 10% NaOH (aq, 2×300 ml), washed with DI water (2×300 ml), dried over sodium sulfate, gravity filtered, and evaporated in-vacuo until all solvent was removed. A clear, viscous liquid was obtained (50 grams, 90% yield). The conversion to ketone-termination was monitored by IR (appearance of a ketone absorbance at approximately 1720 $cm^{-1}$), $^1H$ NMR (integration of new keto-methyl signal at 2.2 ppm and new keto-methylene signal at 4.2 ppm relative to polypropylene methyl signal at 1.2 ppm), hydroxylamine-hydrochloride titration (standard procedure as in Siggia text), and hydroxyl number determination (hydroxyl number decreases as terminal hydroxyl groups are converted to ketone groups).

The conversion of hydroxyl terminated (e.g., $—OCH_2CHOHCH_3$) polyoxyalkylene compounds to the ketone (e.g., $—OCH_2COCH_3$) terminated derivatives does not always proceed to 100% completion. The extent of conversion will depend on the exact conditions of the reaction. In this invention, the percent conversion of hydroxyl terminated starting material to ketone terminated product was determined by titrating the HCl liberated by oxime formation of the modified material reacting with an excess of hydroxylamine hydrochloride (see Siggia et al., Quantitative Organic Analysis Via Functional Groups, 4th Ed., 1979, ISBN 0-471-03273-5, J. Wiley & Sons, NY pp. 95-161). An NMR determination was also used to verify the percent conversions. In the NMR determination of ketone terminated materials, the area of the $^1H$ signal of this methyl ketone singlet at 2.2 ppm (relative to TMS) was compared to the area of $^1H$ signal of the polyoxypropylene methyl doublet at 1.2 ppm (relative to TMS). In both the hydroxylamine analysis and the NMR measurement of the conversion product, the average molecular weight of a ketone terminated polyoxyalkylene compound was assumed to be approximately the same as the average molecular weight of the hydroxyl terminated polyoxyalkylene starting material (established by NMR). The average molecular weights of the Pluronic R hydroxyl terminated polyoxyalkylene compounds were taken from the manufacturer's product literature.

EXAMPLE 2

The foam properties of some ketone terminated polyoxyalkylene compounds were measured by a standard method. A 40 ml portion of a 4 gram/liter solution of the ketone terminated material in aqueous methanesulfonic acid (20%) was poured into a 42 mm diameter glass cylinder fitted near the bottom with a glass frit. Below the glass frit was a gas inlet stopcock. The surfactant solution was aerated with 900 cc/minute of air for 30 seconds. The maximum foam height was measured and then the time necessary for complete foam collapse was recorded. All measurements were at room temperature.

The following table summarizes the foam properties of some typical ketone terminated polyoxyalkylene compounds. All raw materials with the exception of the 3089 and the S660 were Pluronic R polyglycols obtained from BASF Corporation (Parsippany, N.J.). The 3089 (Ethox Chemicals, Greenville, S.C.) and the S660 (Chemax, Greenville, S.C.) were butyl terminated polyoxyethylene-polyoxypropylene ethers. The ketone terminated materials were prepared by the methods mentioned in the Sanderson patent.

| Surfactant | % Conversion to ketone | Maximum Foam Height | Time to Foam Collapse |
|---|---|---|---|
| 10R5 | <2% | 27 cm | 34 sec |
| 10R5 | 48% | 25 cm | 20 sec |
| 17R2 | <2% | 21 cm | 22 sec |
| 17R2 | 45% | 18 cm | 18 sec |
| 17R8 | <2% | 24 cm | 72 sec |
| 17R8 | 98% | 16 cm | 70 sec |
| 25R4 | <2% | 22 cm | 30 sec |
| 25R4 | 21% | 16 cm | 16 sec |
| 3089 | <2% | 30 cm | 30 sec |
| 3089 | 98% | 27 cm | 22 sec |
| S660 | <2% | 32 cm | 31 sec |
| S660 | 35% | 31 cm | 27 sec |
| S660 | 95% | 29 cm | 30 sec |

EXAMPLE 3

A sample of Pluronic 17R8 (BASF, Parsippany, N.J.) was oxidized to the ketone terminated material using sodium hypochlorite (Sanderson patent). The extent of conversion was 98% of theoretical (hydroxylamine determination). The ketone terminated compound will be designated as 17R8KetoA. Two plating baths were formulated as follows;

|  | Bath A | Bath B |
|---|---|---|
| Stannous Methanesulfonate (as tin) | 75 g/l | 75 g/l |
| Plumbous Methanesulfonate | 8 g/l | 8 g/l |

-continued

|  | Bath A | Bath B |
| --- | --- | --- |
| (as lead) |  |  |
| Methanesulfonic acid (70%) | 18% v/v | 18% v/v |
| 17R8 (BASF) | 4 g/l | none |
| 17R8KetoA | none | 4 g/l |
| L62LF (BASF) | 1 g/l | 1 g/l |
| Gallic acid | 2 g/l | 2 g/l |
| 2,9-Dimethyl-Phenanthroline | 1 ppm | 1 ppm |

Hull cell panels (copper plated brass) were plated with cathode rod agitation at 6 amps for 2 minutes. The anode area to cathode are ratio was approximately 1/1, and the anodes were bagged. The plating solutions were filtered prior to use, and plating was carried out at 90° F. Following plating, alloy thickness and composition were measured at various points on the Hull cell panel by X-ray fluorescence. The thicknesses (microinches) and alloy (% tin) data are displayed below;

| Current Density (ASF) | Bath A | | Bath B | |
| --- | --- | --- | --- | --- |
|  | Thickness (microinches) | Alloy (% tin) | Thickness (microinches) | Alloy (% tin) |
| 90 | 330 | 88 | 334 | 89 |
| 120 | 373 | 91 | 388 | 91 |
| 150 | 438 | 90 | 515 | 91 |
| 180 | 513 | 90 | 593 | 91 |
| 240 | 646 | 90 | 722 | 90 |

The plating efficiency at high current densities is significantly better in plating solution B (formulation with ketone terminated surfactant). At any particular current density, a higher current efficiency allows for a greater plating rate. The highest possible plating rate is always sought in modern high speed plating operations, as a higher plating rate allows for a greater work throughput.

EXAMPLE 4

A sample of Ethox 3089 (An alcohol ethylene oxide propylene oxide adduct.) (Ethox Chemicals, Greenville, S.C.) was oxidized to the ketone terminated material using sodium hypochlorite. The extent of conversion was 98% of theoretical (hydroxylamine titration). The ketone terminated compound is designated as 3089KetoA. Two plating baths were formulated as follows;

|  | Bath A | Bath B |
| --- | --- | --- |
| Stannous Methanesulfonate (as tin) | 75 g/l | 75 g/l |
| Plumbous Methanesulfonate (as lead) | 8 g/l | 8 g/l |
| Methanesulfonic acid (70%) | 18% v/v | 18% v/v |
| 3089 (Ethox) | 4 g/l | none |
| 3089KetoA | none | 4 g/l |
| L62LF (BASF) | 1 g/l | 1 g/l |
| Gallic acid | 2 g/l | 2 g/l |
| 2,9-Dimethyl-Phenanthroline | 1 ppm | 1 ppm |

Hull cell panels (copper plated brass) were plated with cathode rod agitation at 6 amps for 2 minutes. The anode area to cathode area ratio was approximately 1/1, and the anodes were bagged. The plating solutions were filtered prior to use, and plating was carried out at 90° F. Following plating, alloy thickness and composition were measured at various points on the Hull cell panel (X-ray fluorescence). The thickness (microinches) and alloy (% tin) data are displayed below;

| Current Density (ASF) | Bath A | | Bath B | |
| --- | --- | --- | --- | --- |
|  | Thickness (microinches) | Alloy (% tin) | Thickness (microinches) | Alloy (% tin) |
| 120 | 417 | 90 | 455 | 91 |
| 150 | 440 | 90 | 488 | 91 |
| 180 | 521 | 90 | 567 | 91 |
| 240 | 640 | 89 | 731 | 90 |

The plating efficiency at high current densities is significantly better in plating solution B (formulation with ketone terminated surfactant). At any particular current density, a higher current efficiency allows for a greater plating rate. The highest possible plating rate is always sought in modern high speed plating operations, as a higher plating rate allows for a greater work throughput.

Also, the grain size of the solder deposits obtained from plating solution B (formulation with ketone terminated surfactant) was significantly finer than the grain size of solder deposits obtained from plating solution A (hydroxyl-terminated surfactant). The grain size was assayed qualitatively by an ink-spread test. A line of blue ink from a felt tip pen was drawn across the surface of the solder deposit of interest, and the width of ink spreading is related inversely to the grain size of the deposit. SEM photographs on selected samples were used to verify the results found with the ink-spread test. Those skilled in the art of solder electrodeposition consider fine grained solder deposits to be superior to more coarsely grained analogs.

EXAMPLE 5

A sample of Pluronic 17R8 (BASF, Parsippany, N.J.) was oxidized to the ketone terminated material using sodium hypochlorite (Sanderson patent). The extent of conversion was 98% of theoretical (hydroxylamine determination). The ketone terminated compound will be designated as 17R8KetoA. Two plating baths were formulated as follows;

|  | Bath A | Bath B |
| --- | --- | --- |
| Stannous Methanesulfonate (as tin) | 75 g/l | 75 g/l |
| Plumbous Methanesulfonate (as lead) | 16 g/l | 16 g/l |
| Methanesulfonic acid (70%) | 18% v/v | 18% v/v |
| 17R8 (BASF) | 4 g/l | none |
| 17R8KetoA | none | 4 g/l |
| L62LF (BASF) | 1 g/l | 1 g/l |
| Gallic acid | 2 g/l | 2 g/l |
| 2,9-Dimethyl-Phenanthroline | 1 ppm | 1 ppm |

Hull cell panels (copper plated brass) were plated with cathode rod agitation at 6 amps for 2 minutes. The anode area to cathode area ratio was approximately 1/1, and the anodes were bagged. The plating solutions were filtered prior to use, and plating was carried out at 90° F. Following plating, alloy thickness and composition were measured at various points on the Hull cell panel (X-ray fluorescence). The thickness (microinches) and alloy (% tin) data are displayed below;

| Current Density (ASF) | Bath A Thickness (microinches) | Alloy (% tin) | Bath B Thickness (microinches) | Alloy (% tin) |
| --- | --- | --- | --- | --- |
| 90 | 352 | 79 | 373 | 78 |
| 120 | 378 | 83 | 432 | 81 |
| 150 | 436 | 83 | 479 | 82 |
| 180 | 556 | 82 | 559 | 83 |
| 240 | 654 | 82 | 742 | 81 |

The plating efficiency at high current densities is significantly better in plating solution B (formulation with ketone terminated surfactant). At any particular current density, a higher current efficiency allows for a greater plating rate. The highest possible plating rate is always sought in modern high speed plating operations, as a higher plating rate allows for a greater work throughput.

EXAMPLE 6

A sample of Pluronic 25R4 (BASF, Parsippany, N.J.) was oxidized to the ketone terminated material using sodium hypochlorite. The extent of conversion was 21% of theoretical (hydroxylamine titration). The ketone terminated compound was designated as 25R4KetoA. Two plating baths were formulated as follows:

| | Bath A | Bath B |
| --- | --- | --- |
| Stannous Methanesulfonate (as tin) | 75 g/l | 75 g/l |
| Plumbous Methanesulfonate (as lead) | 8 g/l | 8 g/l |
| Methanesulfonic acid (70%) | 18% v/v | 18% v/v |
| 25R4 (BASF) | 4 g/l | none |
| 25R4KetoA | none | 4 g/l |
| Gallic acid | 2 g/l | 2 g/l |
| 2,9-Dimethyl-Phenanthroline | 1 ppm | 1 ppm |

Hull cell panels (copper plated brass) were plated with cathode rod agitation at 6 amps for 2 minutes. The anode area to cathode area ratio was approximately 1/1, and the anodes were bagged. The plating solutions were filtered prior to use, and plating was carried out at 90° F.

Plating solution A (hydroxyl-terminated polyoxyalkylene surfactant) produced significant dendritic growth between 90 and 300 ASF on typical Hull cell panels. Plating solution B (ketone terminated polyoxyalkylene surfactant) produced no dendritic growth between 90 and 300 ASF on typical Hull cell panels. The growth of solder dendrites destroys the mechanical integrity of solder deposits. Such dendritic growth is not acceptable in modern high-speed solder plating operations. The suppression of dendrite growth by ketone terminated polyoxyalkylene compounds such as 25R4KetoA is both novel and highly desirable in the solder plating industry.

EXAMPLE 7

A sample of Pluronic 17R2 (BASF, Parsippany, N.J.) was oxidized to the ketone terminated material using sodium hypochlorite. The extent of conversion was 45% of theoretical (hydroxylamine titration). The ketone terminated compound was designated as 17R2KetoA. Two plating baths were formulated as follows;

| | Bath A | Bath B |
| --- | --- | --- |
| Stannous Methanesulfonate (as tin) | 75 g/l | 75 g/l |
| Plumbous Methanesulfonate (as lead) | 8 g/l | 8 g/l |
| Methanesulfonic acid (70%) | 18% v/v | 18% v/v |
| 17R2 (BASF) | 4 g/l | none |
| 17R2KetoA | none | 4 g/l |
| Gallic acid | 2 g/l | 2 g/l |
| 2,9-Dimethyl-Phenanthroline | 1 ppm | 1 ppm |

Hull cell panels (copper plated brass) were plated with cathode rod agitation at 6 amps for 2 minutes. The anode area to cathode area ratio was approximately 1/1, and the anodes were bagged. The plating solutions were filtered prior to use, and plating was carried out at 90° F.

Plating solution A (hydroxyl-terminated polyoxyalkylene surfactant) produced significant dendritic growth between 90 and 300 ASF on typical Hull cell panels. Plating solution B (ketone terminated polyoxyalkylene surfactant) produced no dendritic growth between 90 and 300 ASF on typical Hull cell panels. The growth of solder dendrites destroys the mechanical integrity of solder deposits. Such dendritic growth is not acceptable in modern high-speed solder plating operations. The suppression of dendrite growth by ketone terminated polyoxyalkylene compounds such as 17R2KetoA is both novel and highly desirable.

EXAMPLE 8

A sample of Pluronic 10R5 (BASF, Parsippany, N.J.) was oxidized to the ketone terminated material using sodium hypochlorite. The extent of conversion was 88% of theoretical (hydroxylamine determination). The ketone terminated compound will be designated as 10R5KetoB. Two plating baths were formulated as follows;

| | Bath A | Bath B |
| --- | --- | --- |
| Stannous Methanesulfonate (as tin) | 30 g/l | 30 g/l |
| Antimony Potassium Tartrate (as salt) | 1 g/l | 1 g/l |
| Methanesulfonic acid (70%) | 20% v/v | 20% v/v |
| 10R5 (BASF) | 8 g/l | none |
| 10R5KetoB | none | 8 g/l |

Hull cell panels (copper plated brass) were plated with cathode rod agitation at 2 amps for 3 minutes. The anode area to cathode area ratio was approximately 1/1, and the anodes were bagged. The plating solutions were filtered prior to use, and plating was carried out at 76° F.

Plating solution A (hydroxyl-terminated polyoxyalkylene surfactant) produced a banded solder deposit between the current densities of 20 and 80 ASF. Plating solution B (ketone terminated polyoxyalkylene surfactant) produced a uniform solder deposit between the current densities of 20 and 80 ASF. Banded solder deposits are those in which bands of different appearance (tint, morphology, etc.) occur across the Hull cell panel. Such banded deposits often lead to plated parts with inconsistent and irregular appearance. Industrial solder plating requires that all solder plated parts have a consistently uniform appearance. A solder plating system with a tendency to produce banding will usually not produce consistently uniform plated parts.

EXAMPLE 9

A sample of Pluronic 10R5 (BASF, Parsippany, N.J.) was oxidized to the ketone terminated material using sodium hypochlorite. The extent of conversion was 48% of theoretical (hydroxylamine titration). The ketone terminated compound was designated as 10R5ketoA. Two plating baths were formulated as follows:

|  | Bath A | Bath B |
| --- | --- | --- |
| Stannous Methanesulfonate (as tin) | 30 g/l | 30 g/l |
| Bismuth (III) Methanesulfonate (as bismuth) | 10 g/l | 10 g/l |
| Methanesulfonic acid (70%) | 20% v/v | 20% v/v |
| 10R5 (BASF) | 8 g/l | none |
| 10R5KetoA | none | 8 g/l |

Hull cell panels (copper plated brass) were plated with cathode rod agitation at 2 amps for 3 minutes. The anode area to cathode area ratio was approximately 1/1, and the anodes were bagged. The plating solutions were filtered prior to use, and plating was carried out at 76° F.

Plating solution A (hydroxyl-terminated polyoxyalkylene surfactant) and plating solution B (ketone terminated polyoxyalkylene surfactant) produced similar solder deposits between the current densities of 20 and 80 ASF. Plating solution B was considered superior to plating solution A because of its lower foaming properties.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. An aqueous plating solution comprised of an alkanesulfonic acid, a soluble source of metal ions selected from the group consisting of Sn(II), Sn(II) and Pb(II), Sn(II) and Sb(III), or Sn(II) and Bi(III), and at least one ketone terminated nonionic surfactant, wherein the nonionic surfactants are selected from the group consisting of the following:

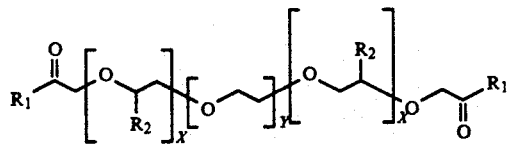

wherein;
X can vary between 0 and 80; Y can vary between 0 and 200; $R_1$ can be a $C_1$ to $C_6$ straight chain alkyl group; $R_2$ can be a $C_1$ to $C_6$ straight chain alkyl group; or,

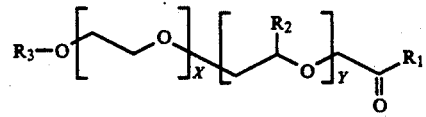

wherein;
X can vary between 0 and 200 and Y can vary between 0 and 120; $R_1$ can be a $C_1$ to $C_6$ straight chain alkyl group; $R_2$ can be a hydrogen or a $C_1$ to $C_6$ straight chain alkyl group; $R_3$ is a hydrophobic residue which can be a $C_1$ to $C_{20}$ straight or branched chain alkyl group, a substituted phenyl group where the substitution is a $C_1$ to $C_{20}$ straight or branched chain alkyl group, a monostyrenated phenyl group, a distyrenated phenyl group, a tristyrenated phenyl group, or any other hydrophobic residue used in the preparation of nonionic surfactants.

2. The plating solution of claim 1, wherein in surfactant formula I, X can vary between 9 and 50, and Y can vary between 6 and 150.

3. The plating solution of claim 1, wherein in surfactant formula I, $R_1$ is a methyl group.

4. The plating solution of claim 1, wherein in surfactant formula I, $R_2$ is a methyl group.

5. The plating solution of claim 1, wherein in surfactant formula II, X can vary between 6 and 150, and Y can vary between 9 and 100.

6. The plating solution of claim 1, wherein in surfactant formula II, $R_1$ is a methyl group.

7. The plating solution of claim 1, wherein in surfactant formula II, $R_2$ is a methyl group.

8. The plating solution of claim 1, wherein in surfactant formula II, $R_3$ is a $C_1$ to $C_{20}$ straight or branched chain alkyl group.

9. The plating solution of claim 1, wherein in surfactant formula II, $R_3$ is a substituted phenyl group where the substitution is a $C_1$ to $C_{20}$ straight or branched chain alkyl group, a monostyrenated phenyl group, a distyrenated phenyl group, or a tristyrenated phenyl group.

10. The plating solution of claim 1, wherein the ketone terminated surfactant has a degree of conversion from the corresponding hydroxyl terminated material(s) of between 5% and 100% of theoretical.

11. The plating solution of claim 1, wherein the water soluble metal ion is a Sn(II) ion.

12. The plating solution of claim 11, wherein the Sn(II) ion is from a Sn(II) methanesulfonate.

13. The plating solution of claim 1, wherein the water soluble metal ions are Sn(II) and Pb(II) ions.

14. The plating solution of claim 13, wherein the Sn(II) and Pb(II) ions are from a Sn(II) and Pb(II) methanesulfonate, respectively.

15. The plating solution of claim 1, wherein the soluble metal ions are Sn(II) and Sb(III) ions.

16. The plating solution of claim 15, wherein the Sn(II) ion is from a Sn(II) methanesulfonate and the Sb(III) ion is an antimony potassium tartrate.

17. The plating solution of claim 1, wherein the soluble metal ions are Sn(II) and Bi(III) ions.

18. The plating solution of claim 17, wherein the tin salt is a methanesulfonate.

19. The plating solution of claim 1, wherein the alkanesulfonic acid is methanesulfonic acid.

20. The plating solution of claim 1, further comprising one or more anionic, cationic surfactants or a mixture thereof.

21. The plating solution of claim 1, further comprising one or more antioxidants selected from the group consisting of di- and trihydroxy benzene derivatives.

22. The plating solution of claim 1, further comprising of one or more nitrogen containing heteroaromatic compounds.

23. An alkanesulfonic acid based plating solution for electroplating tin, tin-lead, tin-antimony and tin-bismuth which contains at least one ketone terminated nonionic surfactant, selected from the following structures:

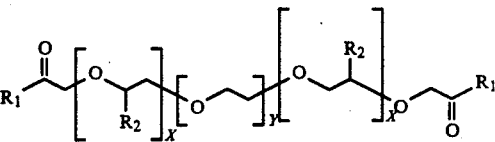

wherein;
X can vary between 0 and 80, and Y can vary between 0 and 200; $R_1$ can be a $C_1$ to $C_6$ straight chain alkyl group; $R_2$ can be a hydrogen or a $C_1$ to $C_6$ straight chain alkyl group; or,

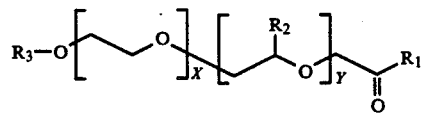

wherein;
X can vary between 0 and 200; and Y can vary between 0 and 120; $R_1$ can be a $C_1$ to $C_6$ straight chain alkyl group; $R_2$ can be a $C_1$ to $C_6$ straight chain alkyl group; $R_3$ is a hydrophobic residue which can be a $C_1$ to $C_{20}$ straight or branched chain alkyl group, a substituted phenyl group where the substitution is a $C_1$ to $C_{20}$ straight or branched chain alkyl group, a monostyrenated phenyl group, a distyrenated phenyl group, a tristyrenated phenyl group, or any other hydrophobic residue used in the preparation of nonionic surfactants.

24. The solution of claim 23, wherein the ketone terminated surfactant has a degree of conversion from the corresponding hydroxyl terminated material(s) of between 5% and 100% of theoretical.

25. The solution of claim 23, which further comprises one or more additional anionic, cationic surfactants or a mixture thereof.

* * * * *

UNITED STATES PATENT AND TRADEMARK OFFICE
CERTIFICATE OF CORRECTION

PATENT NO. : 5,282,953
DATED : February 1, 1994
INVENTOR(S) : Gernon et al.

It is certified that error appears in the above-identified patent and that said Letters Patent is hereby corrected as shown below:

On the title page: section [54], change the first word in the title from "POLYOXYALKLENE" to --POLYOXYALKYLENE--.

At column 1, line 2, change the first word in the title from "POLYOXYALKLENE" to --POLYOXYALKYLENE--.

Signed and Sealed this

Twenty-first Day of June, 1994

Attest:

BRUCE LEHMAN

Attesting Officer     Commissioner of Patents and Trademarks